United States Patent
Zhang et al.

(10) Patent No.: US 7,488,662 B2
(45) Date of Patent: Feb. 10, 2009

(54) SELF-ALIGNED VERTICAL PNP TRANSISTOR FOR HIGH PERFORMANCE SIGE CBICMOS PROCESS

(75) Inventors: Shaoqiang Zhang, Singapore (SG); Purakh Raj Verma, Casablanca (SG); Sanford Chu, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 486 days.

(21) Appl. No.: 11/302,479

(22) Filed: Dec. 13, 2005

(65) Prior Publication Data

US 2007/0134854 A1 Jun. 14, 2007

(51) Int. Cl.
*H01L 21/331* (2006.01)
(52) U.S. Cl. ............... 438/309; 438/312; 438/336; 257/E27.055; 257/E21.383
(58) Field of Classification Search ............. 438/189, 438/202, 203, 234, 235, 309, 312, 313, 322, 438/336, FOR. 165; 257/511, 525, E27.041, 257/E27.042, E27.055, E27.057, E29.174, 257/E21.383
See application file for complete search history.

(56) References Cited

U.S. PATENT DOCUMENTS

| | | | |
|---|---|---|---|
| 5,342,794 A * | 8/1994 | Wei | 438/374 |
| 5,930,635 A | 7/1999 | Bashir | |
| 5,943,564 A * | 8/1999 | Chen et al. | 438/202 |
| 6,359,317 B1 | 3/2002 | Caroll | |
| 6,630,377 B1 | 10/2003 | Panday | |
| 6,699,765 B1 | 3/2004 | Shideler | |
| 6,864,543 B2 * | 3/2005 | Kaneko et al. | 257/371 |
| 2003/0183903 A1 * | 10/2003 | Ikeda | 257/566 |
| 2004/0099895 A1 | 5/2004 | Grey | |

OTHER PUBLICATIONS

D. L. Harame et al., "Current status and future trends of SiGe BiCMOS Technology", IEEE Trans. Electron Devices, vol. 48. pp. 2575-2593, Nov. 2001.
T. Nagano, S. Shukuri, M.Hiraki, M. Minami, A. Watanable and T. Nishida, "What Can Replace BiCMOS at Low supply Voltage Regime?", IEDM Tech. Dig., p. 393, 1992.
C. T. Chuang and D. D. Tang, "High-Speed Low Power AC-Coupled Complementary Push-Pull ECL Circuit," IEEE J. Solid-State Circuit, vol. 27, No. 4, p. 660, 1992.
T. Ikeda, T. Nakashima, S. Kobo, H. Jouba and M. Yamawaki, "A High Performance CBiCMOS with Novel Self-Aligned Vertical PNP Transistor," Proc. of 1994 Bipolar/BiCMOS Circuits & Technology Meeting, p. 238, 1994.

* cited by examiner

*Primary Examiner*—Brook Kebede
(74) *Attorney, Agent, or Firm*—Horizon IP Pte Ltd

(57) ABSTRACT

A structure and a process for a self-aligned vertical PNP transistor for high performance SiGe CBiCMOS process. Embodiments include SiGe CBiCMOS with high-performance SiGe NPN transistors and PNP transistors. As the PNP transistors and NPN transistors contained different types of impurity profile, they need separate lithography and doping step for each transistor. The process is easy to integrate with existing CMOS process to save manufacturing time and cost. As plug-in module, fully integration with SiGe BiCMOS processes. High doping Polysilicon Emitter can increase hole injection efficiency from emitter to base, reduce emitter resistor, and form very shallow EB junction. Self-aligned N+ base implant can reduce base resistor and parasitical EB capacitor. Very low collector resistor benefits from BP layer. PNP transistor can be Isolated from other CMOS and NPN devices by BNwell, Nwell and BN+ junction.

14 Claims, 13 Drawing Sheets

US 7,488,662 B2

SELF-ALIGNED VERTICAL PNP TRANSISTOR FOR HIGH PERFORMANCE SIGE CBICMOS PROCESS

BACKGROUND OF INVENTION

1) Field of the Invention

This invention relates generally to devices and the fabrication of semiconductor devices and more particularly to the fabrication of a vertical PNP transistors and methods for making same in BiCMOS processes.

2) Description of the Prior Art

High speed and low-power LSIs, which operate in the GHz band, has been required for many applications such as the mobile telecommunication and wireless LNAs. The SiGe BiCMOS LSIs have been widely studied as potential candidate. However, the performance of conventional BiCMOS gate circuit, which is composite by CMOS buffer and NPN output driver is poor when the power supply is lower. This degradation at low power supply is due to the Vbe voltage loss and substrate bias effect of the CMOSFET (FIG. 15A). To overcome this problem, several BiCMOS circuits have been proposed. Adding high-speed PNP transistors into the SiGe BiCMOS to form so-called complementary BiCMOS (CBiCMOS) can eliminate voltage loss (See FIG. 15B). The CBiCMOS circuit makes BiCMOS technology application in deep sub-micron regime.

FIG. 15A shows a schematic of a principle circuit of BiCMOS gate and output voltage swing for a conventional BiCMOS. FIG. 15B shows a schematic of a. principle circuit of BiCMOS gate and output voltage swing for a base-charge CBiCMOS. The output voltage is shifted to Vcc+2Vbe, No voltage loss occur.

There is a need for an improved structure and process for a SiGe CBiCMOS with high-performance SiGe NPN transistors and PNP transistors.

The importance of overcoming the various deficiencies noted above is evidenced by the extensive technological development directed to the subject, as documented by the relevant patent and technical literature. The more relevant technical developments in the literature can be gleaned by considering the following.

US 20040099895 A1—Gray, Peter B.; et al.—includes a method and resulting structure for fabricating high performance vertical NPN and PNP transistors for use in BiCMOS devices. The resulting vertical PNP transistor includes an emitter region including silicon and germanium, and has its PNP emitter sharing a single layer of silicon with the NPN transistor's base. The method adds two additional masking steps to conventional fabrication processes for CMOS and bipolar devices, thus representing minor additions to the entire process flow.

U.S. Pat. No. 6,699,765—Shideler, et al.—Method of fabricating a bipolar transistor using selective epitaxially grown SiGe base layer. A transistor includes a collector region in a semiconductor substrate, a base layer overlying the collector region and bound by a field oxide layer, a dielectric isolation layer overlying the base layer, and an emitter structure overlying the dielectric isolation layer and contacting the base layer through a central aperture in the dielectric layer.

U.S. Pat. No. 5,930,635—Bashir, et al.—Complementary Si/SiGe heterojunction bipolar technology—The method results in the fabrication of vertical NPN and PNP transistors which have an identical structure and mode of operation.

U.S. Pat. No. 6,630,377—Panday, et al.—Method for making high-gain vertical bipolar junction transistor structures compatible with CMOS process.

U.S. Pat. No. 6,359,317—Carroll, et al.—shows a Vertical PNP bipolar transistor and its method of fabrication.

U.S. Pat. No. 5,943,564—Chen, et al., BiCMOS process for forming double-poly MOS and bipolar transistors with substantially identical device architectures D. L. Harame et al., "Current status and future trends of SiGe BiCMOS Technology", IEEE Trans. Electron Devices, vol. 48., pp. 2575-2593, November 2001.

T. Nagano, S. Shukuri, M. Hiraki, M. Minami, A. Watanable and T. Nishida, "What Can Replace BiCMOS at Low supply Voltage Regime?", IEDM Tech. Dig., p. 393, 1992

C. T. Chuang and D. D. Tang, "High-Speed Low Power AC-Coupled Complementary Push-Pull ECL Circuit," IEEE J. Solid-State Circuit, Vol. 27, No. 4, p. 660, 1992.

T. Ikeda, T. Nakashima, S. Kobo, H. Jouba and M. Yamawaki, "A High Performance CBiCMOS with Novel Self-Aligned Vertical PNP Transistor," Proc. of 1994 Bipolar/BiCMOS Circuits & Technology Meeting, p. 238, 1994.

SUMMARY OF THE INVENTION

The example embodiments of the present invention provide structures and methods of manufacturing a Self-Aligned Vertical PNP Transistor for High Performance SiGe CBiCMOS Process which is characterized as follows.

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of the summary is to present some example concepts of the invention in a simplified form as a prelude to the more detailed description that is presented later.

An first example method embodiment for a method of forming a VPNP transistor comprised of SiGe, the VPNP transistor is comprised of a VPNP emitter, a VPNP base, a VPNP collector: the method comprising:

providing substrate having a NVPN region and a NPN region; the substrate having a VPNP buried N region around the NVPN region and a NPN buried N region in the NPN region;

forming a buried N well in the VPNP region extending into the VPNP buried N region;

forming a buried P+ region adjacent to and above the buried N well region;

forming an epi layer over the substrate and the buried N well and the VPNP buried N region; the epi layer has a n-doping;

forming a isolation region in the substrate at least between the NVPN region and a NPN region;

forming N wells in the epi layer and substrate; the N wells contact the buried N well;

forming a P well region in the VPNP region; the P well region contacting the buried P region; the P Well in the epi layer and in the substrate; the P well is adjacent to the N Well; portions of the P well are under the isolation region;

forming a VPNP (P) collector region in the epi layer over the VPNP buried P region in the VPNP region;

forming a VPNP (N) base region in the VPNP collector region in the epi layer;

forming a VPNP emitter in the VPNP region;

forming N+ S/D regions in the VPNP region adjacent the VPNP emitter;

forming a VPVP P+ region in the P well region;

forming a VPNP P+ emitter region in the VPNP base.

Another aspect of the example embodiment further comprises:

the substrate having a NPN buried N region in the NPN region;

forming a sinker region in the NPN region in the epi layer that contacts the NPN buried N region;

the epi layer over the a NPN buried N region in the NPN region comprises a N-collector region for a NPN device;

forming a NPN emitter over a NPN SiGe base over the N-collector region in the NPN region; the forming a NPN SiGe base in the NPN region over the epi layer;

forming a NPN N+ emitter in the NPN base;

whereby a resulting NPN transistor be comprised of: NPN emitter; the N+ emitter region, NPN SiGe base region, N-Collector, the BN+ region.

An example embodiment for a device comprised of VPNP transistor comprised of SiGe and a NPN transistor, the VPNP transistor is comprised of a VPNP emitter, a VPNP base, a VPNP collector, the device comprises:

a substrate having a VPNP region and a NPN region;

the substrate having a VPNP buried N region around the NVPN region and a NPN buried N region in the NPN region;

a buried N well in the VPNP region extending into the VPNP buried N region;

a buried P+ region adjacent to and above the buried N well region;

an epi layer over the substrate and the buried N well and the VPNP buried N region;

an isolation region in the substrate at least between the NVPN region and a NPN region;

N wells in the epi layer and substrate; the N wells contact the buried N well;

a P well region in the VPNP region; the P well region contacting the buried P region; the P Well in the epi layer and in the substrate; the P well is adjacent to the N Well; portions of the P well is under the isolation region;

a VPNP (P) collector region in the epi layer over the VPNP buried P region in the VPNP region;

a VPNP (N) base region in the VPNP collector region in the epi layer;

a VPNP emitterin the VPNP region;

N+ S/D regions in the VPNP region adjacent the VPNP emitter;

a VPVP P+ region in the P well region;

a VPNP P+ emitter region in the VPNP base.

Another aspect of the example embodiment further comprises:

the substrate having a NPN buried N region in the NPN region;

a sinker region in the NPN region in the epi layer that contacts the NPN buried N region;

a N-collector region in the epi layer over the a NPN buried N region in the NPN region; the epi layer is doped n-type;

a NPN emitter over a NPN SiGe base over the N-collector region in the NPN region; the a NPN SiGe base in the NPN region over the epi layer;

NPN N+ emitter in the NPN base.

whereby a resulting NPN transistor is comprised of: NPN emitter; the N+ emitter region, NPN SiGe base region, N-Collector, and the BN+ region.

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 14:
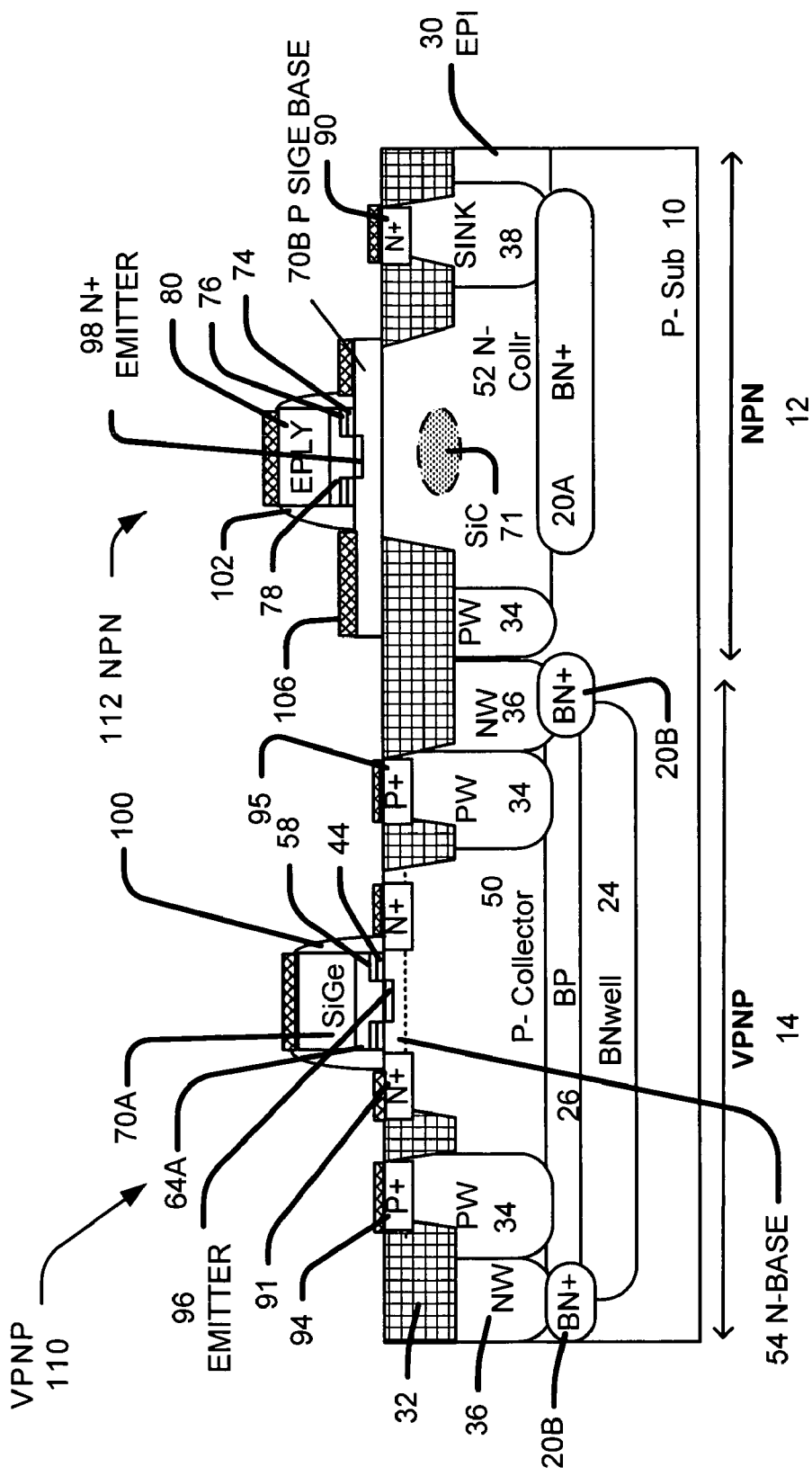

Example embodiments of the present invention will be described in detail with reference to the accompanying drawings. Example embodiments provide a structure and a method of forming a Self-Aligned Vertical PNP Transistor for High Performance SiGe CBiCMOS Process. FIG. 14 shows a cross sectional view of the transistor. In addition CMOS devices can be simultaneously formed.

With reference to the accompanying drawings, FIGS. 1-14 illustrate fabrication process steps. Throughout the drawings, an NPN region 12 in which a vertical NPN transistor will be created is shown on the right, and a VPNP region 14 in which a vertical PNP transistor will be created is shown on the left. It should be recognized that some of the steps of fabrication according to conventional SiGe technology have been omitted for brevity and clarity.

An example method to form the vertical PNP Transistor for SiGe CBiCMOS process as shown in FIGS. 1 to 14.

Figure 15B:
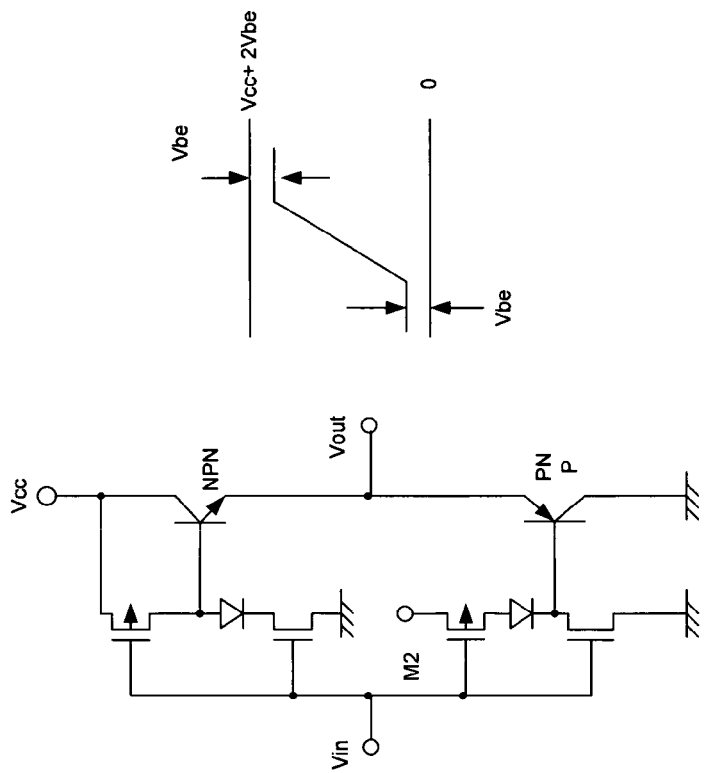
FIG. 15B shows a schematic of a principle circuit of BiCMOS gate and output voltage swing for a base-charge CBiCMOS according to the prior art.
Figure 15A:
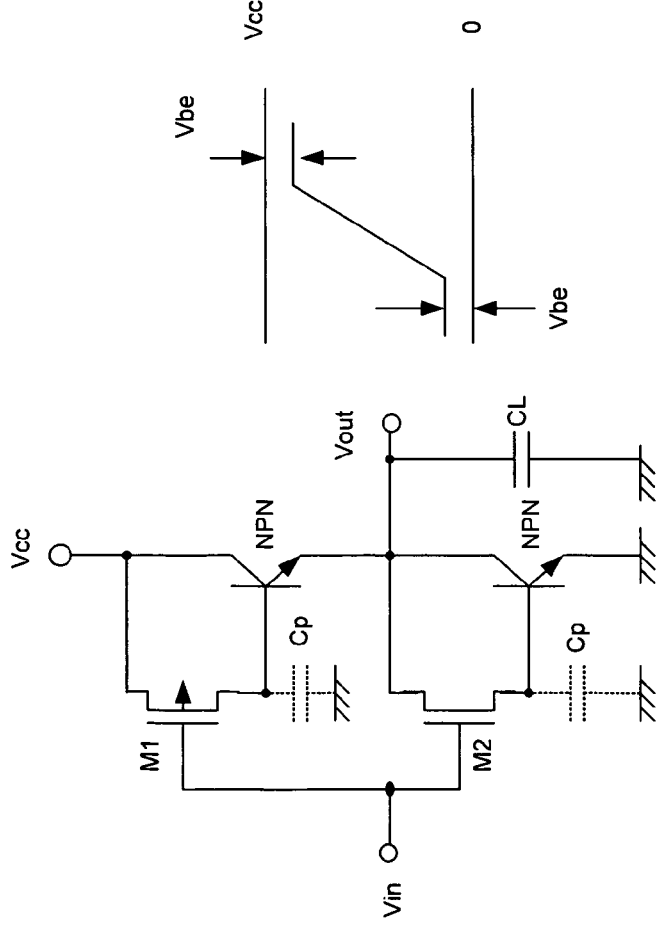
FIG. 15A shows a schematic diagrams of a principle circuit of BiCMOS gate and output voltage swing for a conventional BiCMOS according to the prior art.

FIG. 15B shows a schematic of a principle circuit of BiCMOS gate and output voltage swing for a base-charge CBiCMOS that can be made using the devices of the example embodiments of the invention (such as the VPNP device) 110 FIG. 14.

A. Form a BN Mask, do BN Implant to Form BN Region

Figure 1:
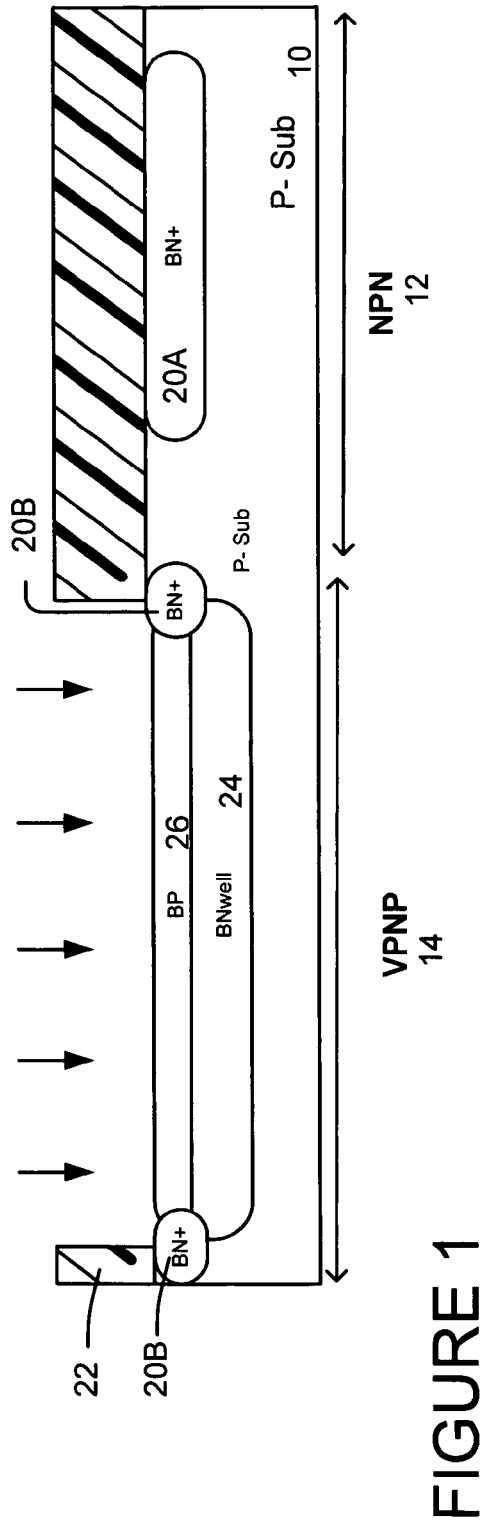
FIGS. 1 through 14 show cross sectional views for a structure and method for forming a VPNP device according to embodiments of the present invention.

As shown in FIG. 1, we provide a substrate having a VPNP region 14, a NPN region 12 and a CMOS device region (not shown). CMOS devices will be formed in the CMOS device along with the steps to form the VPNP and NPN devices.

We form BN Mask (not shown) over the substrate. The BN mask has BN openings over a portion of the NPN region 12 and over portions of the substrate adjacent to the borders of the VPNP region 14 and a NPN region 12.

We implant N-type dopant into the substrate to form a BN+ (buried N+) region 20A in the NPN region 12 and border BN+ regions 20B.

B. Perform Oxidation and Oxide Etching, Grow Sacrificed Oxide, do BP Mask, BN Well and BP Implant Next, we perform an oxidation to form an oxide layer (not shown). Then we etch the oxide layer. The oxide grows faster over the heavily doped BN+ region than the lightly doped substrate. Since the oxide consumes silicon, when this oxide is etched away, 600A-800A steps exist at the edge of the BN+ region and become alignment marks that allow subsequence mask level to be aligned with the BN+ layer.

C. Form BN Well

We perform an oxidation to form 80 angstroms to 120 angstroms (target 100 A) of sacrificed oxide (not shown).

We form a BP/BN mask 22 over the NPN region 12. The BP/BN mask 22 has opening over the VPNP region 14 where the BP region 26 and the BN well 24 will be formed.

We perform a BN well Implant to form a BN well (buried N-type well) 24 in the VPNP region 14.

D. Form BP Layer

Next, we perform a BP (buried P-type) implant to form a BP (buried P-type layer) layer 26 above the BN well 24 in the VPNP region. The subsequently formed VPNP has a very low collector resistance because of the high P concentration BP layer 26.

The buried P-type layer 26 (BP layer) provides a low resistance path for PNP collector current flow.

The BP mask 22 is removed.

E. Grow Epi Layer

Figure 2:
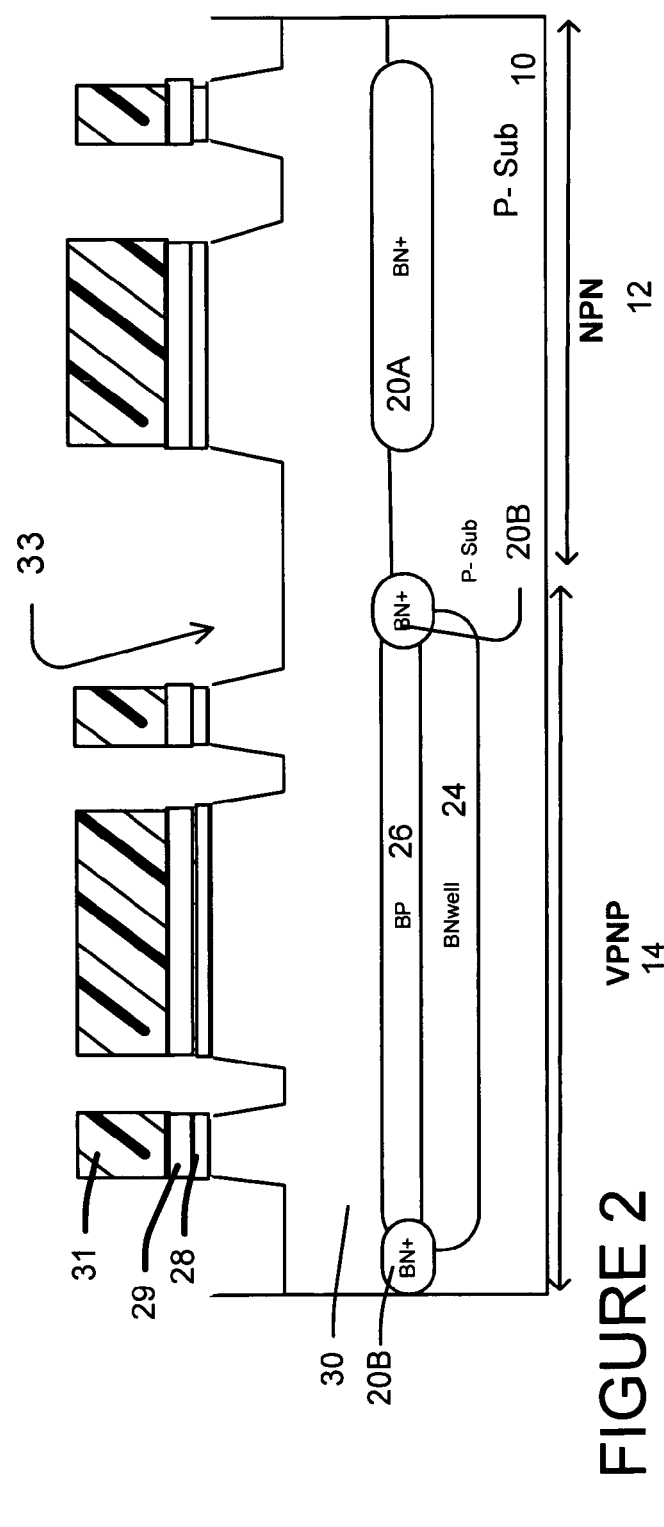
Figure 4:
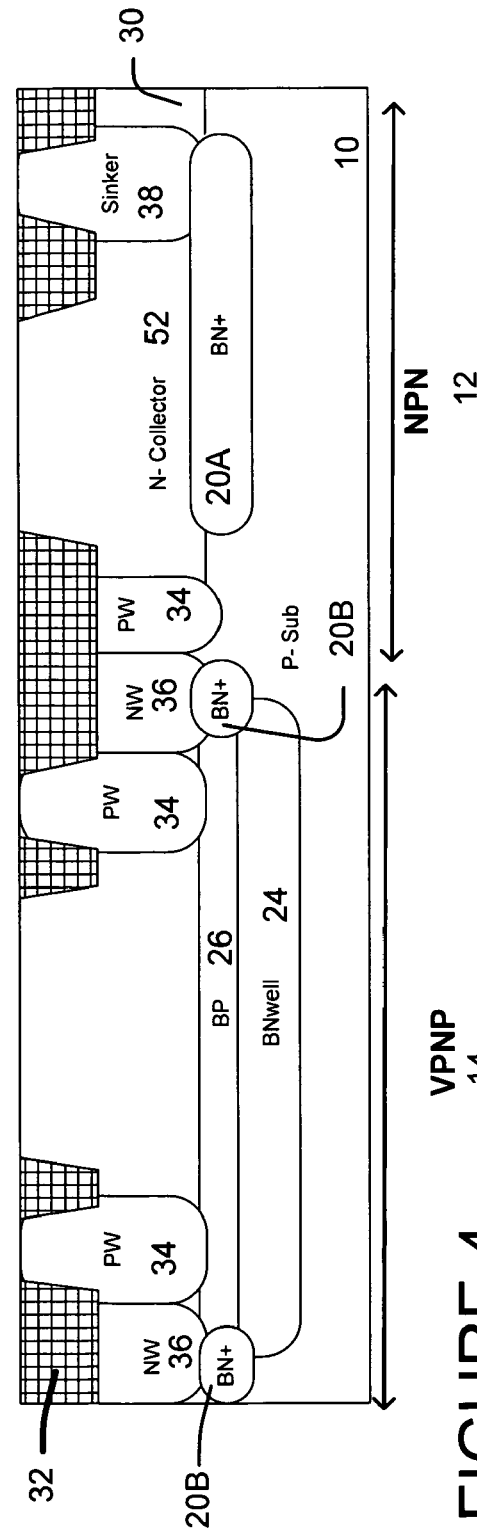

Referring to FIG. 2, we then grow an epi layer 30 over the substrate surface. The epi layer is preferably doped with a n-type dopant. The epi layer is preferably n-type doped with an concentration between 1E16 and 2E16 atoms/cc. As shown in FIG. 4, the n-doped epi layer comprises the N-collector in the NPN Tx.

F. Form STI Trenches

As shown in FIG. 2, we form a STI trenches 33. Preferably we form a pad oxide 28 and masking (e.g., nitride) layer 29.

Next, we form STI regions 32 using preferably using a etching and oxide process. We form a STI mask 31 (e.g., L10 mask) having STI opening. We etch the pad oxide 28, masking (e.g., nitride) layer 29 and substrate to form STI trenches 33.

G. Grow STI Liner Oxide and Fill HDP, then do L11 Mask and Oxide Etchback, do Oxide CMP to Form Planar STI We can grow a STI liner dielectric layer (not shown) (e.g., oxide) on the STI trench sidewalls.

Figure 3:
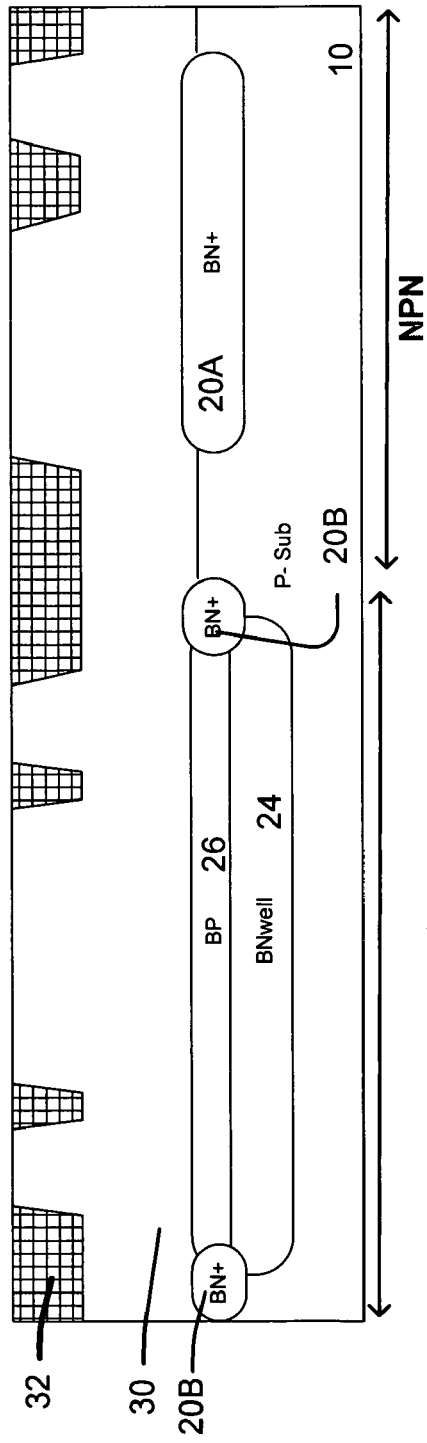

As shown in FIG. 3, next we form at least isolation regions 32 (STI region 32) between the NVPN region 14 and the NPN region 12.

We can form at least isolation regions 32 by filling the trench with a dielectric material, preferably a HDP oxide material.

Next we can planarize the STI region 32 preferably by performing a oxide etchback and then a oxide chemical-mechanical polish (CMP) to form a STI region 32 with a planar top surface.

H. After Sacrificial Oxide Growth, do Sinker Mask, Sinker Implant and Driving, then NW Mask and Implant, PW Mask and Implant the Sequentially Steps Process on CMOS Device Region, Including Vt Adjustment Implant, Gate Oxide Grow, Poly Deposition and Poly Gate Etching, LDD Implant and Nitride Space.

Form Sinker 38

Referring to FIG. 4, in Step 4, we form a sacrificed oxide layer on the epi surface.

Next we form a Sinker mask (not shown).

For a sinker region 38 by performing a sinker Implant The sinker region has a N type doping or impurity.

The sinker 38 is adjacent to and contacts the buried n+ region 20A.

We then remove the sinker mask.

We then preferably perform a drive in anneal.

Form N-Well 36

Then we form a N-well (NW) mask over the epi surface. We perform a N Well implant to form N-wells 36. The n-wells 36 contact the BN+ regions 20B.

We then remove the N-well (NW) mask.

PW Mask and Implant.

Next we form a P Well (PW) 34 in the epi layer 30 and in the substrate 10. The P well is adjacent to the N Well 34. The p well is under the isolation regions 32. The P well A P-well mask is formed. We performs a P-well implant. We remove the p-well mask.

N-Collector Region 52

As shown in FIG. 4, the n-doped epi layer comprises the N-collector 52 in the NPN Tx.

The N collector region 52 preferably has a n type impurity concentration between 1E16 and 2E16 atoms/cm$^3$.

CMOS Device Area Steps

The following sequentially steps process can be performed on CMOS device region, including Vt adjustment implant, gate oxide grow, poly deposition (for CMOS gate) and poly gate etching, LDD implant (to form CMOS LDD regions) and nitride spacer (formed on CMOS gate sidewalls) and CMOS S/D I/I. The steps can form a CMOS FET in the CMOS region.

I. Deposit CMOS Protector Layer, do the Second BP Mask, then P-Collector and N-Base Implant Referring to FIG. 5, we deposit a dielectric protector layer 44 (e.g., CMOS protector layer) on the substrate surface. The dielectric protector layer 44 can be formed of TEOS oxide and can have a thickness about of 200 angstroms+/−10%. The dielectric protector layer 44 (e.g., CMOS protector layer) can have multiple functions, 1) used as a buffer layer for subsequence SiN deposition, because the SiN is high stress film and not able adhere well on silicon; 2) a sacrificial oxide for the implant; 3) the composite dielectric layer of VPNP emitter window to separate Emitter Poly with Base region.

We then form a second BP mask 46 over the NPN region 12.

We perform a P-collector Implant to form a P-collector (VPNP P collector region) 50 in the VPNP region 14.

We perform a N-base Implant to form a N-base region 54 in the P collector 50 in the VPNP region 14. The N-base region 54 can have a concentration between 8E18/cm$^3$ and 2E19/cm$^3$. The N-base region 54 can extend to the top surface of said epi layer.

J. Form Nitride, do Pwin Mask (New) and Emitter Window Etching

Figure 6:
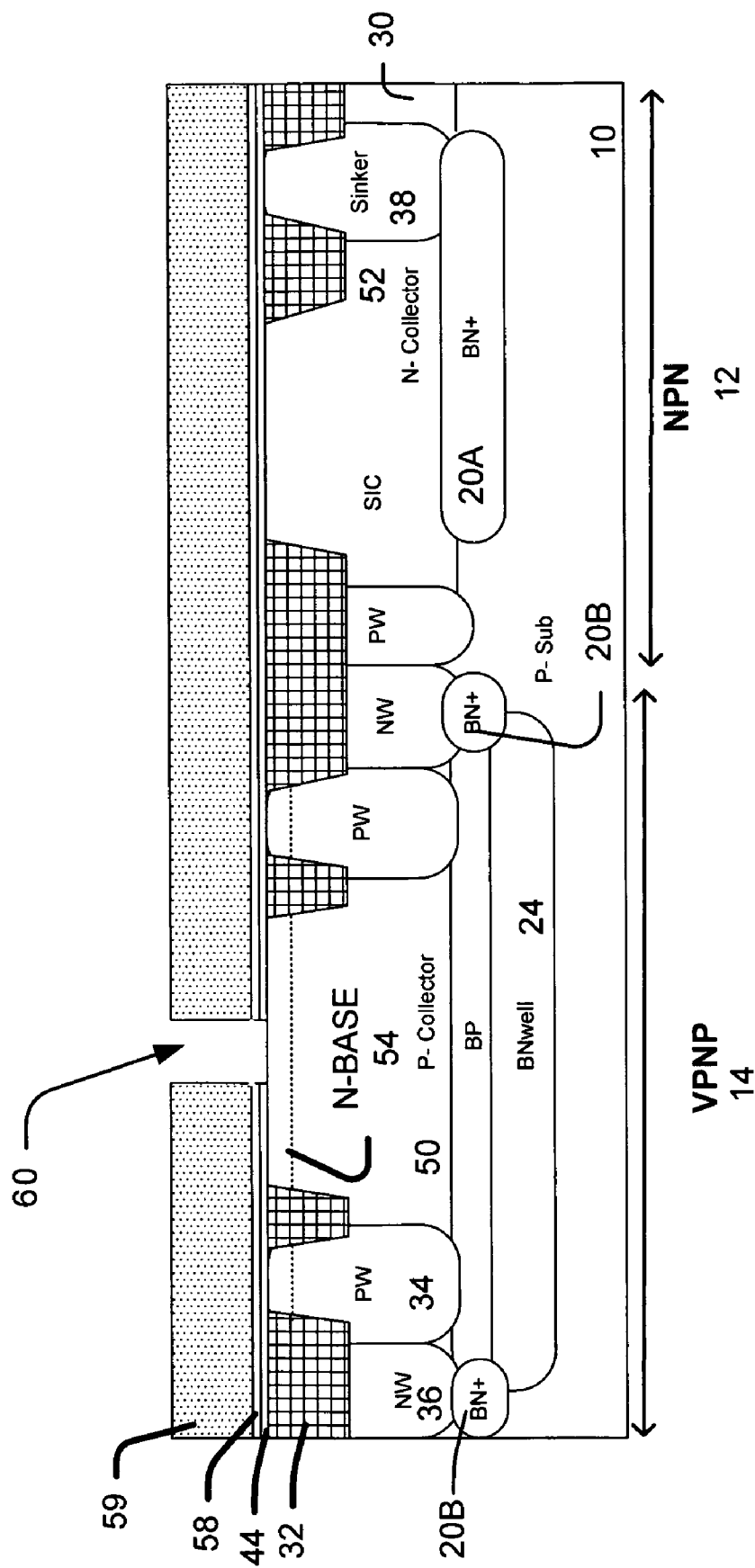

Referring to FIG. 6, we form lower dielectric layer (e.g., SIN) 58 over the dielectric protector layer 44. The dielectric layer 58 is preferably comprised of nitride and preferably has a thickness between 180 and 220 Å. (target—200 Å)

The SiN layer 44 can be used as etch stop layer to control subsequence Pwin and Base Poly etching, it is also used as dielectric layer to forms VPNP emitter window.

We form a Pwin Mask 59 having a PNP Emitter opening (60) over the n base region 54.

We form a PNP emitter opening 60 in the dielectric layer 58 and the dielectric protector layer 44 to expose the n base region 54. We can etch the dielectric layer 58 and the dielectric protector layer 44 using the Pwin mask 59 as an etch mask to form the PNP emitter opening 60.

We remover the Pwin Mask 59.

Figure 7:
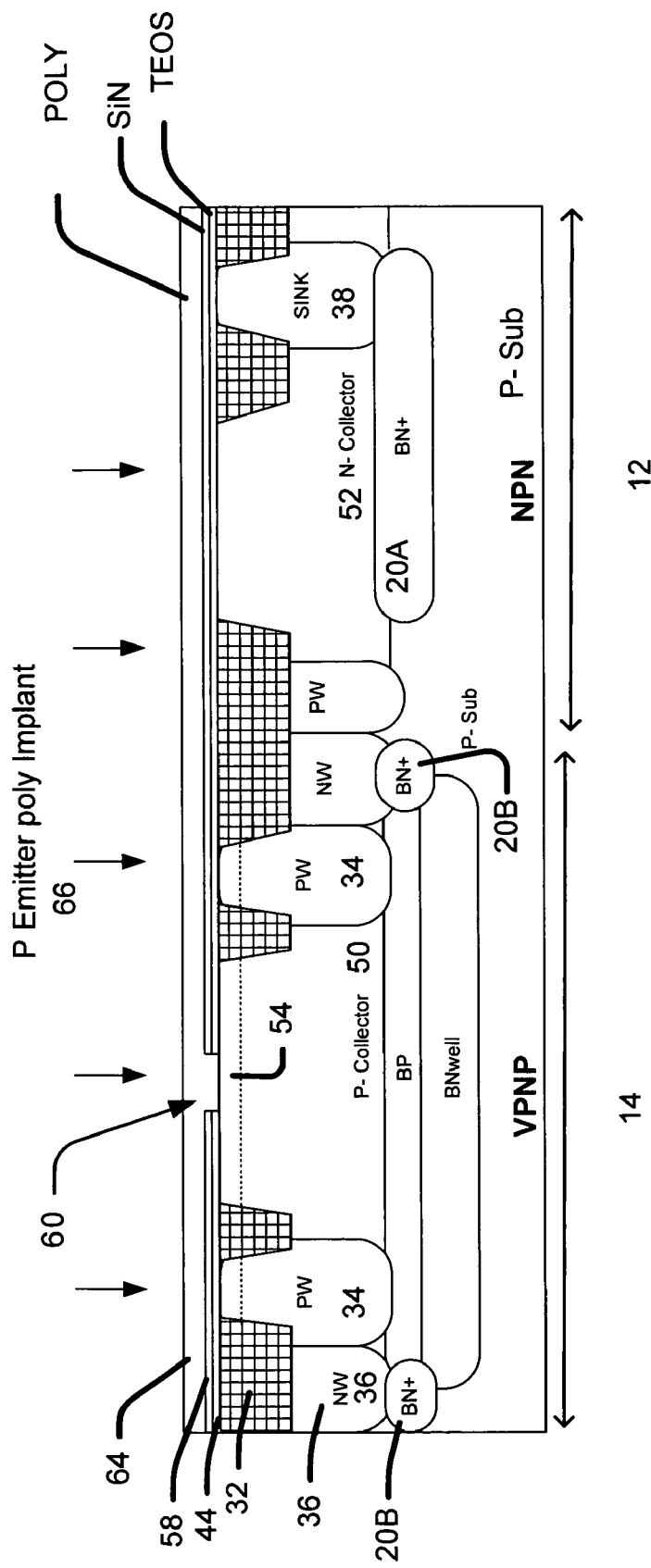

K. Deposit CMOS Protector Layer and Also Used as PNP Emitter Poly; Do P Emitter Poly Implant;

Referring to FIG. 7, we form a protector (e.g., polysilicon) layer 64 over the N base region 54 and the dielectric layer 58. The polysilicon layer 64 will be etched to form the PNP emitter poly. The polysilicon layer 64 is used to as buffer silicon layer for SiGe growth. The SiGe film 70 can not directly deposit on oxide or nitride due to poor adherence.

The protector (e.g., polysilicon) layer 64 preferably has a thickness in the opening 60 between 540 and 660 Å (tgt 600 Å).

We perform a P Emitter poly Implant 66 into the polysilicon layer 64 to dope the polysilicon layer 64 and to subsequently form a P emitter 64A (See FIG. 8).

Figure 11:
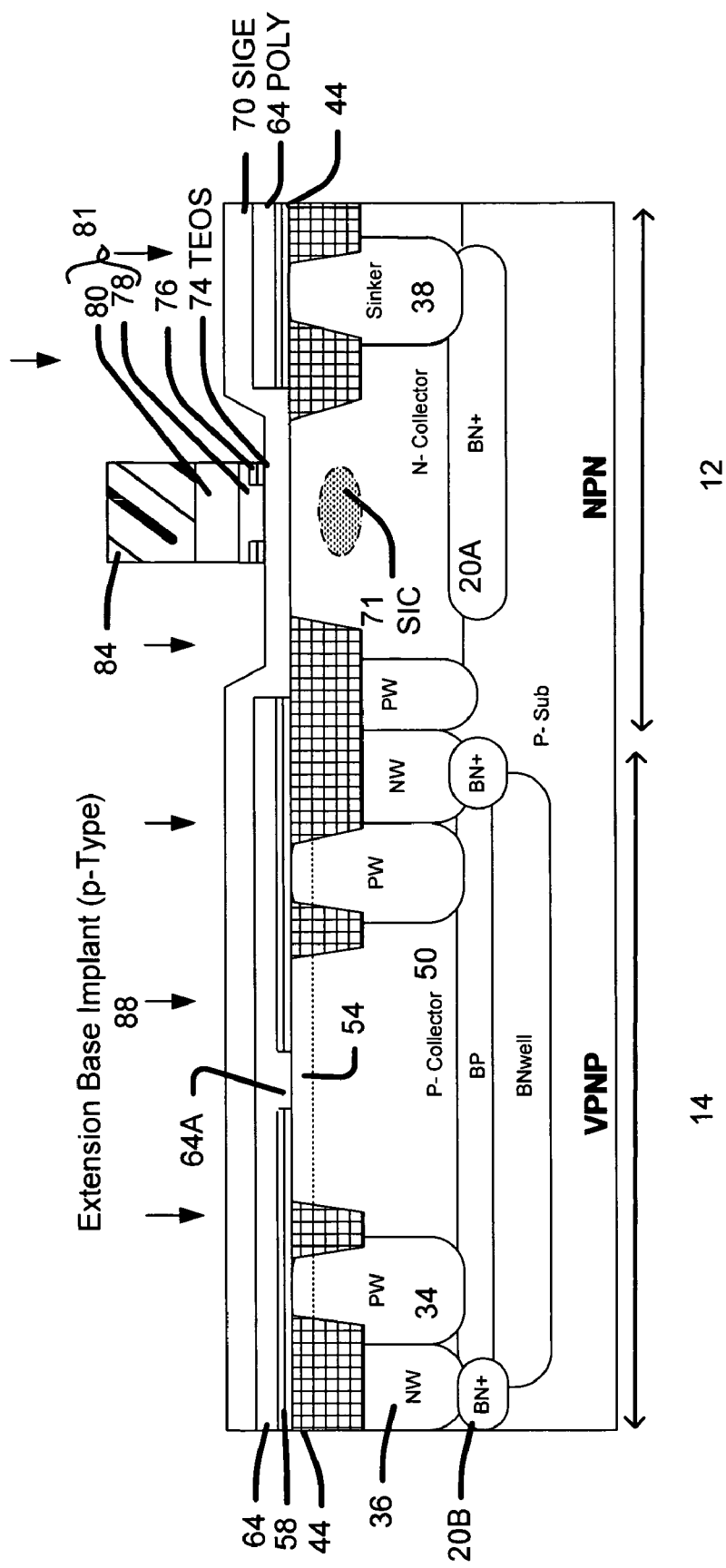

The P emitter region 64A preferably has a p-type dopant concentration between 1E20 and 2E20/cm3 after extension base implant (refer FIG. 11).

L. Open NPN Base Region by BJT Mask and Etching and then do SIC Mask and SIC Implant Referring to FIG. 8, we expose the NPN base region in the NPN region 12 by forming a BJT mask 65 with a NPN base opening 65A and etching the polysilicon layer 64, dielectric layer 58 and a dielectric protector layer 44.

M. Form SIC Mask and Perform a SIC Implant

Next, we can form a SIC mask (not shown) that has an SiC opening in the NPN region 12. We can perform an optional SIC implant to form a SiC region 71 in the N-collector region 52 under the subsequently formed P SiGe base 70B. The SIC implant is an option step to get high Ft NPN device by tuning collector dopant profile.

N. Grow SiGe Base Layer 70, Upper Dielectric Layer 75 (e.g., TEOS 74 and Nitride Layers 76)

Figure 9:
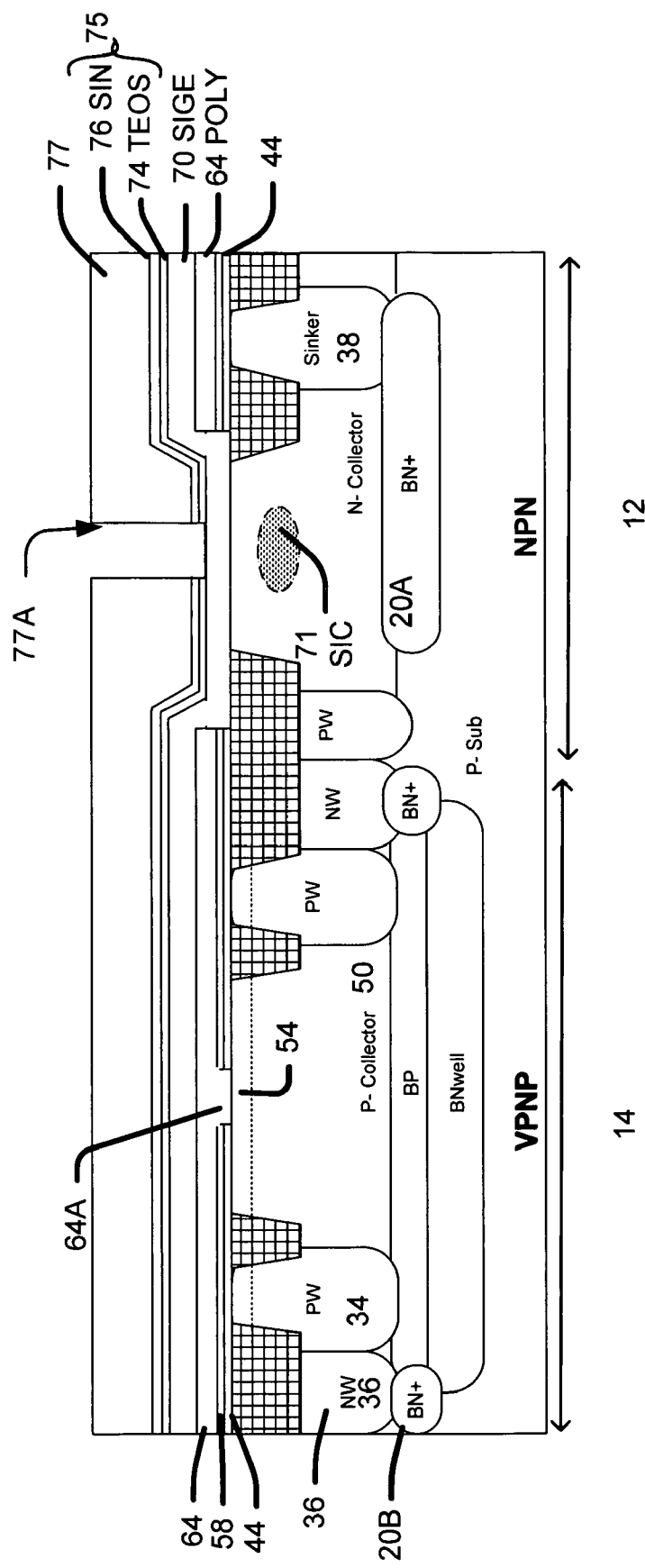

Referring to FIG. 9, we grow a SiGe Base layer 70. The SiGe layer 70 can have a thickness between 850 and 950 angstroms and can be doped with a p-type dopant such as boron.

The SiGe base layer 70 is comprised of Germanium makes up no less than 10% of the silicon and germanium, and wherein the germanium makes up no more than 30% of the silicon and germanium.

Then we form an upper dielectric layer 75. The upper dielectric layer 75 can be comprised of an oxide layer 74 and a nitride layer 76. For example, we can form an oxide layer 74 that can be formed of TEOS and that can have a thickness between 180 and 220 angstroms.

We then form a nitride layer 76 that can have a thickness between 180 and 220 angstroms.

O. Form N-EWIN Mask and Etching to Remove the Layers

Still referring to FIG. 9, we form a N-EWIN mask (N-emitter window mask) 77 that has an N-emitter mask opening 77A over the NPN region 12.

We then etch the layers 74 76 exposed in the N-emitter mask opening to form a N-emitter opening where the N-emitter will be deposited.

We then remove the N-EWIN mask (N-emitter window mask) 77.

P. Form Emitter Layer

Figure 10:
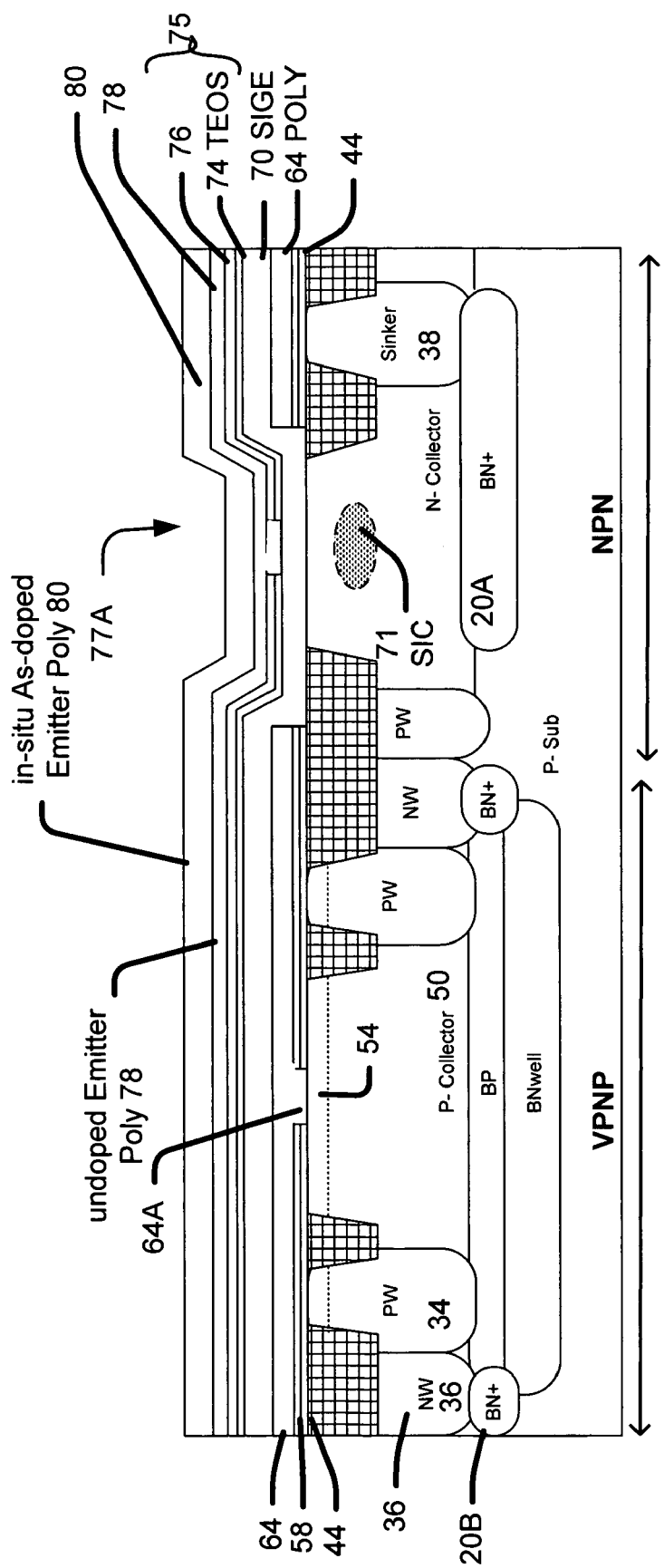

Referring to FIG. 10, we form an emitter layer 81. The emitter layer 81 can be comprised of two layers, such as a first emitter layer 78 and a second emitter layer 80.

For example, we can form a first Emitter (Poly) layer 78. We then perform a N-type Emitter implant to dope the first emitter poly layer 78.

We then grow (in-situ As-doped) second Emitter Poly layer 80 that can have a thickness between 1800 and 2200 angstroms. The second emitter layer 80 can have a n-type dopant concentration about 2E20/sq-cm+/−10%.

Q. Do Emitter Poly Mask and Etching, the Etching Stop on SiGe Layer. To Keep Resist, do Extension Base Implant (P_Type)

Referring to FIG. 11, we form an Emitter Poly mask 84 that covers at least the NPN emitter region in the NPN region 12.

Using the mask 84 as an etch mask, we etch the oxide layer 74 and nitride layer 74 76 and emitter layer 81, to form the NPN emitter 80 78 (81). The etch stops on SiGe layer 70.

Next, with the Emitter Poly mask 84 still in place, we perform a Extension Base Implant 88 (e.g., p_type) to dope the SiGe layer 70 and layer 64 with a p-type dopant.

The SiGe layer 70 can have a p-dopant concentration between 1E20 and 2E20/cm$^3$.

The P emitter region 64A preferably has a p-type dopant concentration between 1E20 and 2E20/cm3 after extension base implant.

R. Grow TEOS.—do Base Poly Mask, this Mask Also Pattern PNP Emitter. Then remove SiGe/Poly/Nitride/TEOS Multi-Layers, which Composite as CMOS Protector Layer Referring to FIG. 12, we form an insulating layer (90A 90B) (e.g., implant block layer). The implant block layer can be made by a TEOS oxide process and preferably has a thickness between 380 and 420 Angstroms. The (TEOS) insulating layer (90A 90B) layer is to make sure PNP Emitter does not accept subsequence N+ self-aligned implant.

The implant block layer 90A 90B to prevents the PNP Emitter do not get implanted by the subsequence N+ self-aligned implant.)

We next form a Base Poly and PNP emitter mask 94B 94A that covers the NPN Base poly 70B and the PNP emitter 70A 64A. (VPNP SiGe Emitter 70A) (VPNP POLY Emitter 64A)

Using the mask 94A 94B as an etch mask, we etch and remove the SiGe/Poly/Nitride/TEOS multi-layers, which composite as a CMOS protector layer. The etch forms insulating layer 90A 90B.

S. Form N+ S/D Mask and Perform a N+ Implant to Form N+ S/D Regions and Form PNP Self-Align High Doped Base Region.

Figure 13:
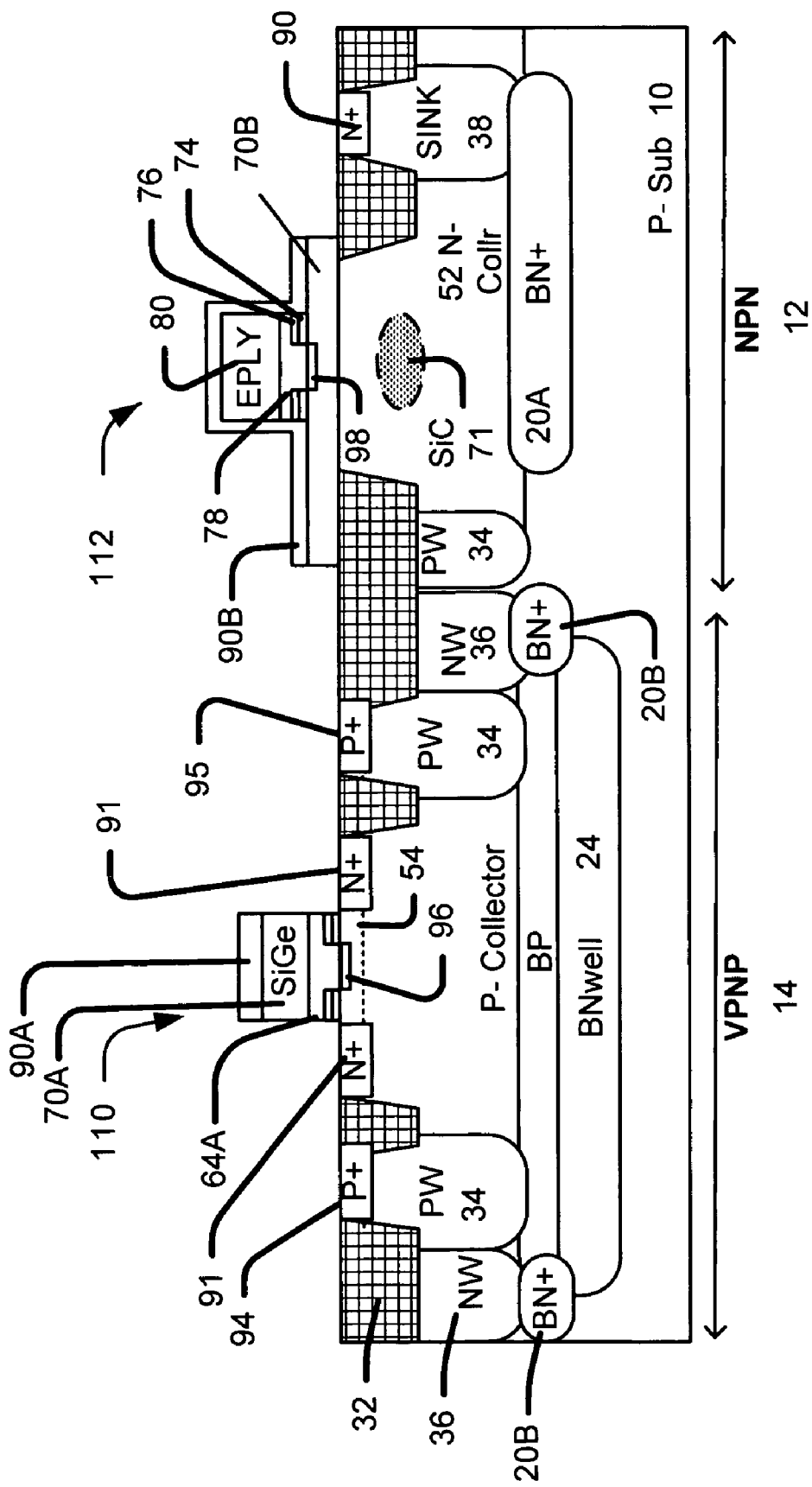

Referring to FIG. 13, we form a N+ S/D Mask (not shown) having opening where the N+ S/D regions will be formed.

We perform a N+ Implant to form N+ S/D regions 91 that function as the PNP self-align high doped Base region 91. The N_S/D regions 91 can have a N-type impurity concentration of about 2E20/cm$^3$. The implant also forms N+ S/D region 91 in the Sinker regions in the NPN region 12.

T. Do P+ S/D Mask and P+ Implant the Subsequence RTA Active S/D Dopant, Meantime, the Dopant in NPN and PNP Emitter Poly is Also Out-Diffused into SiGe or Silicon to Form Shallow Emitter Region Next, we form a P+ S/D Mask (not shown) having openings were the P+ S/D region will be formed.

We perform a P+ implant to form VPNP P+ regions 95 in the PW 34 in the VPNP region 14. For VPNP and NPN parts, no other regions are absorbed P+ implant.

Next, we perform a RTA to active the P and N type S/D dopants. During the anneal, the dopant in NPN and PNP Emitters 78 64A (poly) also out-diffuses into NPN SiGe base 70B or the PNP N-Base region 26 (e.g., silicon) to form shallow PNP Emitter region 96 and shallow NPN emitter region 98.

U. FIG. 14, Then Deposit 150A TEOS and 900A Nitride to Form NPN and PNP Space to Avoid Emitter and Base Short During Salicide Process.

Referring to FIG. 14, we form NPN spacers 102 and VPNP spacers (BJT SiN spacers) 100. In an example process we grow a TEOS layer (150 angstrom) and a Nitride layer (900 angstroms), perform space etching to form NPN and PNP spacer which can prevent Emitter and Base short during a subsequent silicide/salicide process. The insulating layer (90A 90B) layer is also removed during space etching.

Next, we grow a TEOS layer (400 angstrom) named as salicide block (SAB) layer, perform SAB mask (not shown) and SAB etching to remove SAB TEOS layer in all CMOS and BJT device region. Next, we form silicide region 106 on the exposed silicon surfaces.

This forms the PNP device 110 and the NPN device 112.

V. Alternate Embodiments—Modifications

The CMOS process steps not shown may include gate oxide growth, FET polysilicon deposition and etch, spacer growths and/or depositions and etches, extension and halo masks and implants, source/drain masks and implants, etc.

W. Overview of Example Process Steps

Figure 5:
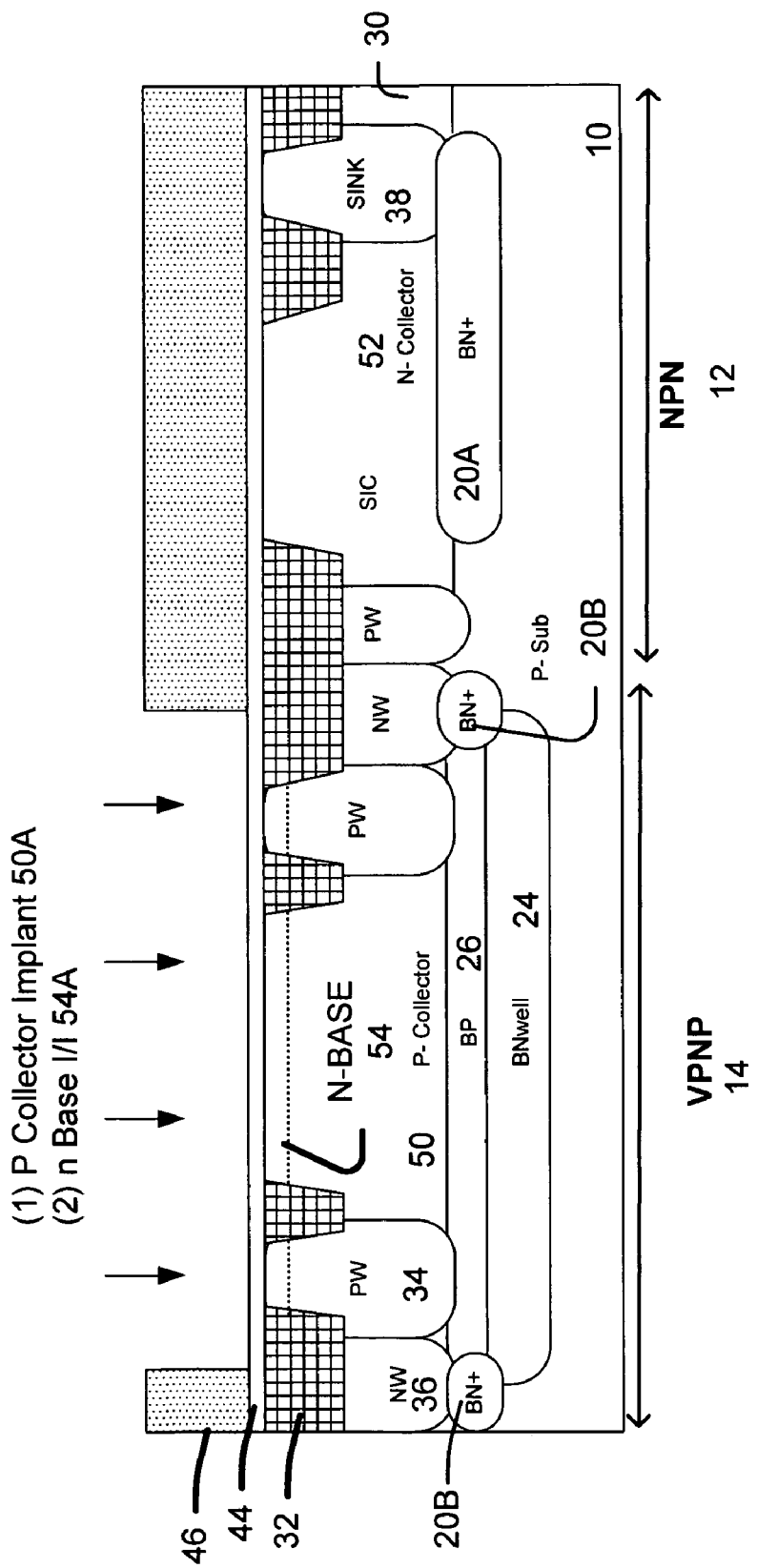
Figure 8:
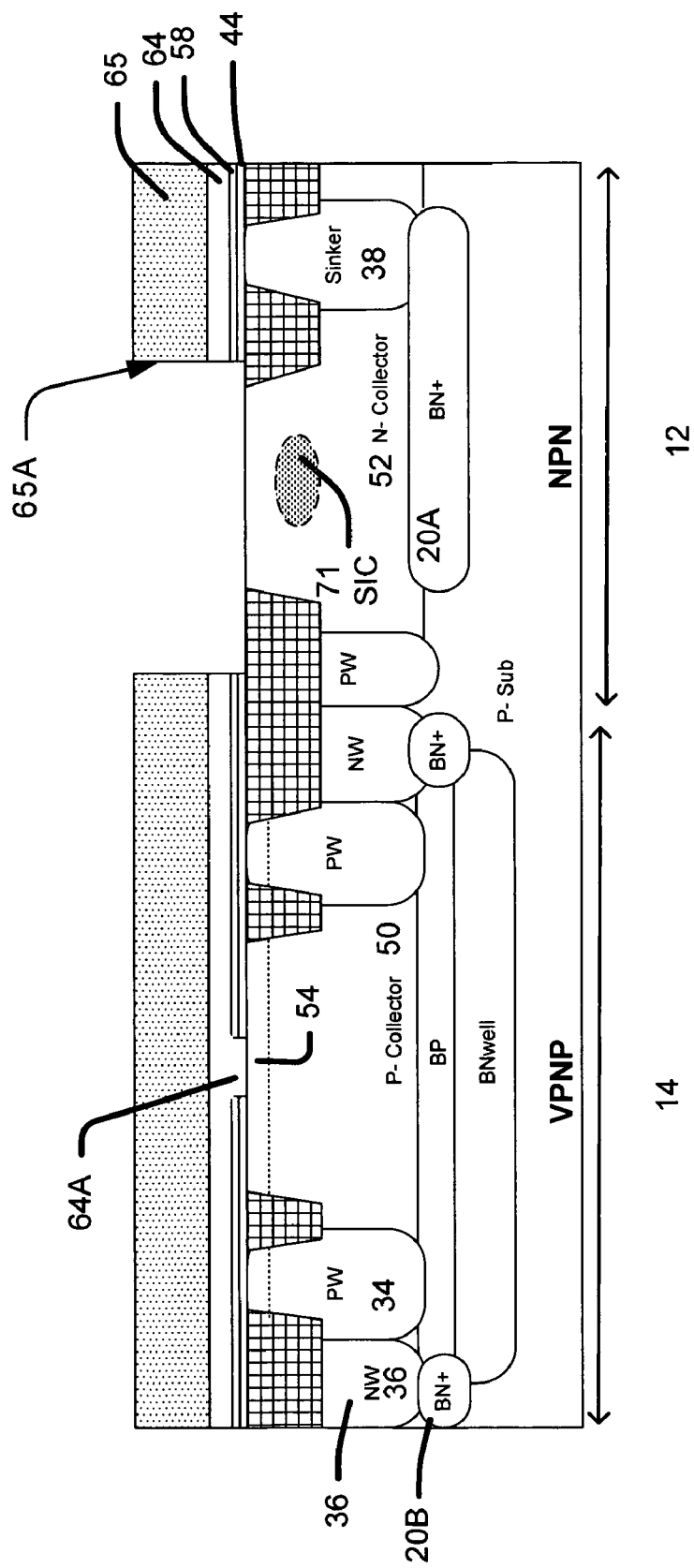
Figure 12:
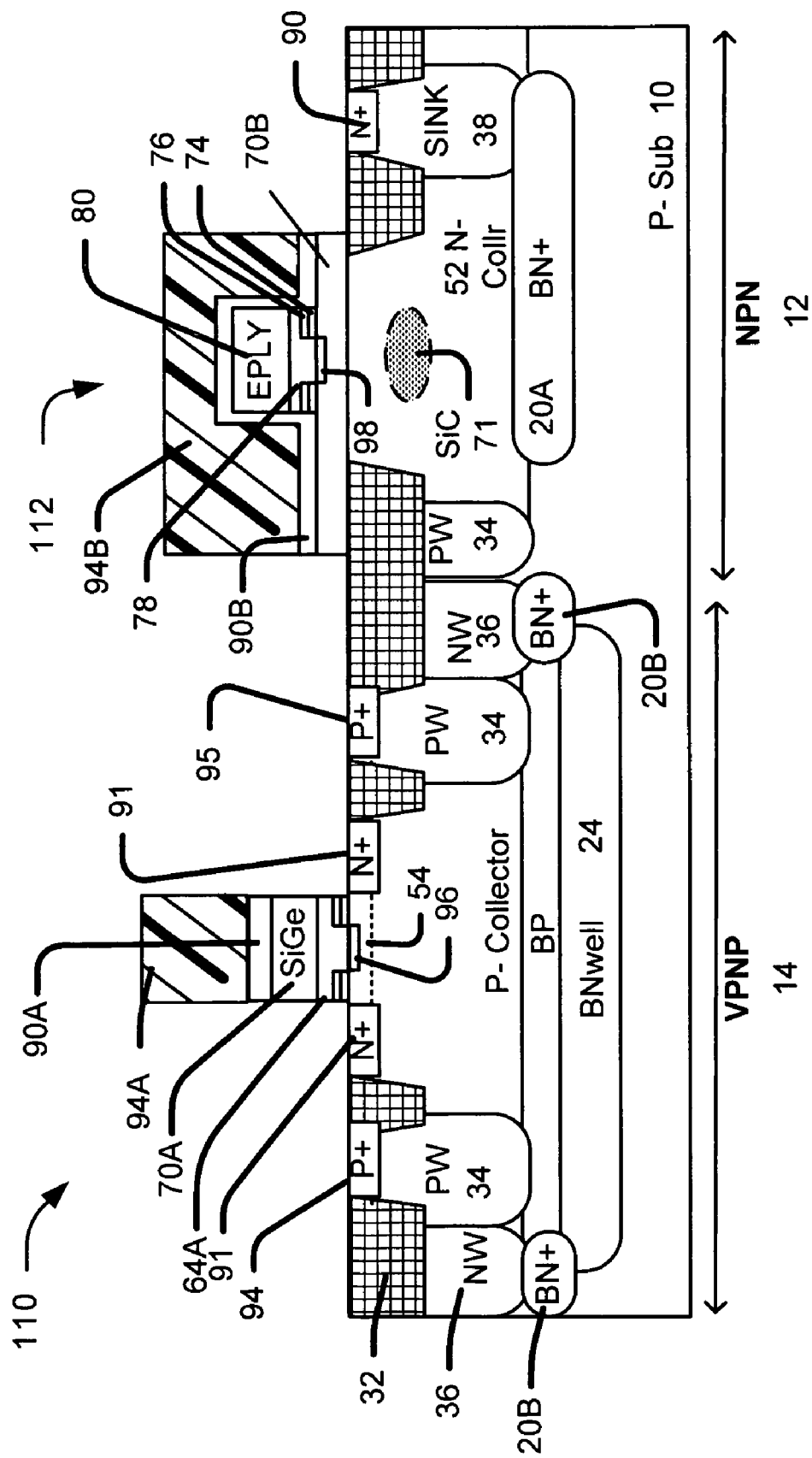

An example overview is a method of forming a VPNP transistor comprised of SiGe while forming a CMOS device and an NPN transistor using at least three masking steps in addition to masking steps utilized in forming the CMOS and NPN devices, the VPNP transistor is comprised of a VPNP emitter, a VPNP base, a VPNP collector and the NPN transistor is comprised of a NPN emitter, a NPN base and a NPN collector, the method comprises the following steps:

FIG. 1—provide a substrate 10 having a VPNP buried N region 20B around the VNPN region 14 and a NPN buried N region 20A in the NPN region;

forming a buried N well 24 in the VPNP region extending into the VPNP buried N region 20B;

forming a buried P+ region 26 adjacent to and above the buried N well region 24;

FIG. 2—forming an epi layer 30 over the substrate 10; the epi layer is doped n-type;

FIGS. 2 & 3—forming isolation region 32 in the substrate at least between the NPN region 12 and the VPVP region 14;

FIG. 4—forming a sinker region 38 the NPN region that contacts the NPN buried N region 20A;

FIG. 4—forming N wells 36 in the epi layer and substrate; the N wells 36 contact the buried N well 20B;

FIG. 4—forming a P well region 34 in the VPNP region 14; the P well region 34 contacting the buried P region 26;

a N-collector region 52 for the NPN transistor is comprised of the epi layer over the a NPN buried N region 20A in the NPN region; the epi layer is doped n-type;

FIG. 5—forming a VPNP (P) collector region (P collector 50) over the VPNP buried P region 26 in the VPNP region 14;

FIG. 5—forming a VPNP (N) base region 54 in the VPNP (P) collector region 50;

FIG. 6—forming a lower dielectric layer 58 over the substrate; the lower dielectric layer 58 has an (VPVP) emitter opening 60 over the VPNP (N) base region 54;

FIG. 7 forming an emitter poly layer 64 over the first dielectric layer 58 44 and filling the (VPVP) emitter opening 60;

FIG. 7—doping the emitter poly layer 64 with a p-type dopant;

FIG. 8—forming a NPN base region opening in the emitter poly layer 64 over the lower dielectric layer 58 over the NPN region 12;

FIG. 9—forming a SiGe layer 70 over the poly layer 64 and filling the NPN base region opening;

forming an upper dielectric layer 75 over the SiGe layer 70; the upper dielectric layer having an NPN emitter opening exposing the SiGe layer 70;

FIG. 10—forming an emitter poly layer 78 80 over the an upper dielectric layer 75 and filling the NPN emitter opening in upper dielectric layer 75 over the SiGe layer 70;

FIG. 11—forming an NPN emitter 81 (78 80) over the SiGe layer 70 by patterning the emitter poly layer 78 80 and the upper dielectric layer 75 (74 76);

FIG. 11—doping the SiGe layer 70 in the VPNP region 14 with a p type dopant;

FIG. 12—forming an insulating layer 90 (teos 90) over the SiGe layer 70, and the NPN emitter 81;

FIG.-12—patterning the insulating layer 90 (teos 90), the SiGe layer 70 and the lower dielectric layer 58 44 to form a VPNP emitter 70A 64A in the VPNP region 14 and a NPN base 70B in the NPN region 12;

FIG. 13—forming N+ S/D regions 91 in the VPNP region 14;

FIG. 13—forming VPNP P+ region 95 in the P well region 34;

FIG. 13—forming a VPNP P+ emitter region 96 in the VPNP base 54 by diffusing P dopants from the VPNP emitter 70A 64A;

FIG. 13—forming a N+ emitter 98 in the NPN base 70B.

X. Overview of Example Device

II. Device

An example device embodiment is shown in FIG. 14.

The device comprises VPNP transistor comprised of SiGe, a CMOS device and an NPN transistor. The VPNP transistor is preferably comprised of a VPNP emitter, a VPNP base, a VPNP collector and the NPN transistor preferably is comprised of a NPN emitter, a NPN base and a NPN collector.

In more detail, referring to FIG. 14, an example overview of device comprised of a VPNP transistor comprised of SiGe while forming a CMOS device and an NPN transistor. The VPNP transistor is comprised of a VPNP emitter, a VPNP base, a VPNP collector and the NPN transistor is comprised of a NPN emitter, a NPN base and a NPN collector. The device comprises the following:

a substrate 10 having a NVPN region 14 and a NPN region;

the substrate having a VPNP buried N region 20B around the NVPN region 14 and a NPN buried N region 20A in the NPN region;

a buried N well 24 in the VPNP region extending into the VPNP buried N region 20B;

a buried P+ region 26 adjacent to and above the buried N well region 24;

an epi layer 30 over the substrate and the buried N well 24 and the VPNP buried N region 20B;

a isolation region 32 in the substrate at least between the NVPN region 14 and a NPN region 12;

a sinker region 38 in the NPN region in the epi layer that contacts the NPN buried N region 20A;

N wells 36 in the epi layer and substrate; the N wells contact the buried N well 20B;

a P well region 34 in the VPNP region 14; the P well region 34 contacting the buried P region 26; the P Well (PW) 34 in the epi layer 30 and in the substrate 10; the P well is adjacent to the N Well 36; portions of the P well 34 is under the isolation region 32;

a N-collector region 52 in the epi layer over the a NPN buried N region 20A in the NPN region; the epi layer is doped n-type;

a VPNP (P) collector region (P collector 50) in the epi layer over the VPNP buried P region 26 in the VPNP region 14;

a VPNP (N) base region 54 in the VPNP collector region 50 in the epi layer;

a NPN emitter 81 (78 80) over a NPN SiGe base 70B over the N-collector region 52 in the NPN region 12; the a VPNP emitter 70A 64A in the VPNP region 14;

a NPN SiGe base 70B in the NPN region 12 over the epi layer 30;

N+ S/D regions 91 in the VPNP region 14 adjacent the VPNP emitter 70A 64A 96;

a VPNP P+ region 95 in the P well region 34;

a VPNP P+ emitter region 96 in the VPNP base 54 by diffusing P dopants from the VPNP emitter 70A 64A;

FIG. 13—forming a NPN N+ emitter 98 in the NPN base 70B.

A. Table of Element

Below is an partial table of elements:

Partial Table of elements

| name | element |
| --- | --- |
| Substrate | 10 |
| VPNP region | 12 |
| VPNP region | 14 |
| BN well | 24 |
| (buried P+ type layer) buried P+ layer | 26 |
| P well | 34 |
| Epi layer | 30 |
| N wells | 36 |
| Sinker region | 38 |
| dielectric protector layer | 44 |
| second BP mask | 46 |
| VPNP (P) collector region | 50 |
| VPNP (N) base region N-base region | 54 |
| lower dielectric layer (e.g., SIN) | 58 |
| Pwin Mask | 59 |
| PNP emitter opening | 60 |
| protector (e.g., polysilicon) layer | 64 |
| P Emitter poly Implant | 66 |
| NPN SiC region | 71 |
| teos | 74 |
| nitride | 76 |
| N-EWIN mask | 77 |
| Extension Base Implant | 88 |
| N+ S/D regions | 90 |
| VPVP P+ regions | 95 |
| VPNP P+ emitter region | 96 |
| | 98 |
| NPN N+ emitter | 98 |
| silicide regions | 106 |
| BN+ (buried N+) region | 20A |
| border BN+ regions | 20B |
| VPNP polysilicon layer | 64A |
| VPNP SiGe layer | 70A |
| VPNP emitter | 70A 64A 96 |
| NPN SiGe base | 70B |
| NPN emitter | 81 (78 80) |
| VPVP cap insulating layer | 90A |

III. Non-Limiting Advantages of Some Example Embodiments

Some of the example embodiments of the self-aligned VPNP transistors provide some the following benefits:

Only two extra reticles, three mask steps.

BN mask 22 (FIG. 1) and BP mask 46 (FIG. 5) (same reticle for

BN mask 22 and BP mask 46). and Pwin mask 59 (FIG. 6)

As plug-in module, fully integration with SiGe BiCMOS processes.

High doping Polysilicon Emitter can increase hole injection efficiency from emitter to base, reduce emitter resistor, and form very shallow EB junction.

High doping Polysilicon Emitter can have a dopant concentration range between 1E20 and 2E20/cm3

Self-aligned N+ base implant to form N+ base region 54 can reduce base resistance and parasitical EB capacitor.

Very low collector resistor benefits from BP layer 26.

PNP transistor is Isolated from other CMOS and NPN devices by BNwell, Nwell and BN+ junction.

With reference to FIG. 14, the resulting NPN transistor 112 can comprise: N emitter 80 78; N+ emitter region 98, P SiGe base region 70B, N Collector 52 BN+ region 20A and silicide regions 106.

The Vertical PNP (VPNP) transistor 110 can comprise: Emitter (having a SiGe top portion 70A and a polysilicon bottom portion 64A), a P+ emitter region 96, N base region 26, a P collector region 50 and a buried P region 26 below and adjacent to the P collector region, silicide regions 106.

At least the following elements are new and useful:

1) Bnwell 24 structure isolation VPNP to other device;
2) BP region 26 provide a low resistance path for VPNP collector current;
3) TEOS dielectric protector layer 44 and lower dielectric layer (e.g., SIN) 58 help form VPNP emitter window 60 (FIGS. 6 and 7);
4) SiGe used as VPNP Emitter layer;
5) VPNP SiGe Emitter 70A+ Space combine self-align VPNP.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of forming a VPNP transistor comprised of SiGe, the VPNP transistor is comprised of a VPNP emitter, a VPNP base, a VPNP collector, the method comprising:

providing substrate having a VPNP region and a NPN region; said substrate having a VPNP buried N region around said VPNP region and a NPN buried N region in said NPN region;

forming a buried N well in said VPNP region extending into said VPNP buried N region;

forming a buried P+ region adjacent to and above said buried N well region;

forming an epi layer over the substrate and the buried N well and the VPNP buried N region; said epi layer has a n-doping;

forming an isolation region in said substrate at least between the VPNP region and a NPN region;

forming N wells in said epi layer and substrate; said N wells contact said buried N well;

forming a P well region in said VPNP region, wherein said P well region contacting said buried P region, the P Well in the epi layer and in the substrate, the P well is adjacent to the N Well, and portions of the P well are under the isolation region;

forming a VPNP, P-collector region in said epi layer over said VPNP buried P region in said VPNP region;

forming a VPNP N-base region in said VPNP collector region in said epi layer;

forming a VPNP emitter in the VPNP region;

forming N+ S/D regions in said VPNP region adjacent said VPNP emitter;

forming a VPNP P+ region in the P well region; and forming a VPNP P+ emitter region in the VPNP base.

2. The method of claim 1 which further comprises:

said substrate having a NPN buried N (BN+) region in said NPN region;

forming a sinker region in said NPN region in the epi layer that contacts said NPN buried N region;

said epi layer over said NPN buried N region in said NPN region comprises a N-collector region for a NPN device;

forming a NPN emitter over a NPN SiGe base over said N-collector region in said NPN region;

forming a NPN SiGe base in the NPN region over the epi layer; and forming a NPN N+ emitter in the NPN base, whereby a resulting NPN transistor be comprised off NPN emitter, the N+ emitter region, NPN SiGe base region, N-Collector, and the BN+ region.

3. A method of forming a VPNP transistor comprised of SiGe while forming a NPN transistor, the VPNP transistor is comprised of a VPNP emitter, a VPNP base, a VPNP collector and the NPN transistor is comprised of a NPN emitter, a NPN base and a NPN collector, the method comprising:

providing substrate having a VPNP region and a NPN region; said substrate having a VPNP buried N region around said VPNP region and a NPN buried N region in said NPN region;

forming a buried N well in said VPNP region extending into said VPNP buried N region;

forming a buried P+ region adjacent to and above said buried N well region;

forming an epi layer over the substrate and the buried N well and the VPNP buried N region;

forming an isolation region in said substrate at least between the VPNP region and a NPN region;

forming a sinker region in said NPN region in the epi layer that contacts said NPN buried N region;

forming N wells in said epi layer and substrate; said N wells contact said buried N well;

forming a P well region in said VPNP region, wherein said P well region contacting said buried P region, the P Well in the epi layer and in the substrate, the P well is adjacent to the N Well, and portions of the P well are under the isolation region;

the epi layer over said NPN buried N region in said NPN region comprises a N-collector region for the NPN transistor;

forming a VPNP P-collector region in said epi layer over said VPNP buried P region in said VPNP region;

forming a VPNP N-base region in said VPNP collector region in said epi layer;

forming a NPN emitter over a NPN SiGe base over said N-collector region in said NPN region;

forming a VPNP emitter in the VPNP region;

forming a NPN SiGe base in the NPN region over the epi layer;

forming N+ S/D regions in said VPNP region adjacent said VPNP emitter;

forming a VPNP P+ region in the P well region;

forming a VPNP P+ emitter region in the VPNP base; and forming a NPN N+ emitter in the NPN base.

4. A method of forming a VPNP transistor comprised of SiGe while forming a CMOS device and an NPN transistor using at least three masking steps in addition to masking steps utilized in forming the CMOS and NPN devices, the VPNP transistor is comprised of a VPNP emitter, a VPNP base, a VPNP collector and the NPN transistor is comprised of a NPN emitter, a NPN base and a NPN collector, the method comprising:

providing a substrate having a VPNP buried N region around said VPNP region and a NPN buried N region in said NPN region;

forming a buried N well in said VPNP region extending into said VPNP buried N region;

forming a buried P+ region adjacent to and above said buried N well region;

forming an epi layer over the substrate; said epi layer is doped n-type;

forming isolation region in said substrate at least between said NPN region and said VPNP region;

forming a sinker region in said NPN region that contacts said NPN buried N region;

forming N wells in said epi layer and substrate; said N wells contact said buried N well;

forming a P well region in said VPNP region, wherein said P well region contacting said buried P region, the epi layer over said NPN buried N region in said NPN region comprises a N-collector region for the NPN transistor; said epi layer is doped n-type;

forming a VPNP P-collector region over said VPNP buried P region in said VPNP region;

forming a VPNP N-base region in said VPNP P-collector region;

forming a lower dielectric layer over the substrate; said lower dielectric layer has an (VPNP) emitter opening over the VPNP N-base region;

forming an emitter poly layer over the first dielectric layer and filling the (VPNP) emitter opening;

doping the emitter poly layer with a p-type dopant;

forming a NPN base region opening in the emitter poly layer over the lower dielectric layer over the NPN region;

forming a SiGe layer over the poly layer and filling the NPN base region opening;

forming an upper dielectric layer over the SiGe layer; said upper dielectric layer having an NPN emitter opening exposing the SiGe layer;

forming an emitter poly layer over the upper dielectric layer and filling the NPN emitter opening in the upper dielectric layer over the SiGe layer;

forming an NPN emitter over the SiGe layer by patterning the emitter poly layer and the upper dielectric layer;

doping the SiGe layer in the VPNP region with a p type dopant;

forming an insulating layer over the SiGe layer, and the NPN emitter;

patterning the insulating layer, the SiGe layer and the lower dielectric layer to form a VPNP emitter in the VPNP region and a NPN base in the NPN region;

forming N+ S/D regions in said VPNP region;

forming VPNP P+ region in the P well region;

forming a VPNP P+ emitter region in the VPNP base by diffusing P dopants from said VPNP emitter; and forming a N+ emitter in the NPN base.

5. The method of claim 4 which further includes:
forming silicide regions over the epi layer and VPNP base, and the NPN emitter.

6. The method of claim 4 which further includes
in a first masking step, forming a first mask that defines a first opening through which implants for the buried P region in the VPNP region are made;
in a second masking step, forming a second mask that defines a second opening through which implants for a VPNP collector of the VPNP transistor and a VPNP base of the VPNP transistor in the VPNP region are subsequently made; and
a third masking step, forming a third mask that defines the VPNP emitter of the VPNP transistor.

7. The method of claim 4 which further includes a fourth masking step that further defines the VPNP emitter and the NPN base.

8. A device comprised of VPNP transistor comprised of SiGe, the VPNP transistor is comprised of a VPNP emitter, a VPNP base, a VPNP collector, the device comprising:
a substrate having a VPNP region and a NPN region;
said substrate having a VPNP buried N region around said (VPVP) region and a NPN buried N (BN+) region in said NPN region;
a buried N well in said VPNP region extending into said VPNP buried N region;
a buried P+ region adjacent to and above said buried N well region;
an epi layer over the substrate and the buried N well and the VPNP buried N region;
an isolation region in said substrate at least between the (VPNP) region and a NPN region;
N wells in said epi layer and substrate; said N wells contact said buried N well;
a P well region in said VPNP region, wherein said P well region contacting said buried P region, the P Well in the epi layer and in the substrate, the P well is adjacent to the N Well, and portions of the P well are under the isolation region;
a VPNP P-collector region in said epi layer over said VPNP buried P region in said VPNP region;
a VPNP N-base region in said VPNP collector region in said epi layer;
a VPNP emitter in the VPNP region; said VPNP emitter comprised of SiGe;
N+ S/D regions in said VPNP region adjacent said VPNP emitter;
a VPNP P+ region in the P well region; and
a VPNP P+ emitter region in the VPNP base.

9. The device of claim 8 which further comprises:
said substrate having a NPN buried N region in said NPN region;
a sinker region in said NPN region in the epi layer that contacts said NPN buried N region;
a N-collector region in the epi layer over said NPN buried N region in said NPN region; said epi layer is doped n-type;
a NPN emitter over a NPN SiGe base over said N-collector region in said NPN region;
a NPN SiGe base in the NPN region over the epi layer;
NPN N+ emitter in the NPN base,
whereby a resulting NPN transistor is comprised of NPN emitter, the N+ emitter region, NPN SiGe base region, N-Collector, and the BN+ region.

10. A device comprised of VPNP transistor comprised of SiGe and a NPN transistor, the VPNP transistor is comprised of a VPNP emitter, a VPNP base, a VPNP collector and the NPN transistor is comprised of a NPN emitter, a NPN base and a NPN collector, the device comprising:
substrate having a VPNP region and a NPN region;
said substrate having a VPNP buried N region around said VPNP region and a NPN buried N region in said NPN region;
a buried N well in said VPNP region extending into said VPNP buried N region;
a buried P+ region adjacent to and above said buried N well region;
an epi layer over the substrate and the buried N well and the VPNP buried N region;
an isolation region in said substrate at least between the VPNP region and the NPN region;
a sinker region in said NPN region in the epi layer that contacts said NPN buried N region;
N wells in said epi layer and substrate; said N wells contact said buried N well;
a P well region in said VPNP region, wherein said P well region contacting said buried P region, the P Well in the epi layer and in the substrate, the P well is adjacent to the N Well, and portions of the P well are under the isolation region;
a N-collector region in the epi layer over said a NPN buried N region in said NPN region; said epi layer is doped n-type;
a VPNP P-collector region in said epi layer over said VPNP buried P region in said VPNP region;
a VPNP N-base region in said VPNP collector region in said epi layer;
a NPN emitter over a NPN SiGe base over said N-collector region in said NPN region;
a VPNP emitter in the VPNP region; said VPNP emitter comprised of SiGe;
a NPN SiGe base in the NPN region over the epi layer;
N+ S/D regions in said VPNP region adjacent said VPNP emitter;
a VPNP P+ region in the P well region;
a VPNP P+ emitter region in the VPNP base; and
NPN N+ emitter in the NPN base.

11. The device of claim 10 which further includes silicide regions over the N+ S/D regions epi layer and VPNP base, and the NPN emitter.

12. The device of claim 10 wherein said sinker region has a n type doping.

13. The device of claim 10 which further includes a SiC region in the N-collector region; said SiC region below the top surface of the epi layer whereby the SiC region can tune the collector dopant profile.

14. The device of claim 10 wherein said VPNP emitter is comprised of a VPNP SiGe layer over a VPNP polysilicon layer and VPNP P+ emitter region in the VPNP base.

* * * * *